(12) United States Patent
Kolobov et al.

(10) Patent No.: US 11,749,774 B2
(45) Date of Patent: Sep. 5, 2023

(54) AVALANCHE PHOTODETECTOR (VARIANTS) AND METHOD FOR MANUFACTURING THE SAME (VARIANTS)

(71) Applicant: DEPHAN LLC, Moscow (RU)

(72) Inventors: Nikolai Afanasevich Kolobov, Moscow (RU); Konstantin Yurevich Sitarskiy, Moscow (RU); Vitalii Emmanuilovich Shubin, Moscow (RU); Dmitrii Alekseevich Shushakov, Moscow (RU); Sergei Vitalevich Bogdanov, Moscow (RU)

(73) Assignee: DEPHAN LLC, Moscow (RU)

( * ) Notice: Subject to any disclaimer, the term of this patent is extended or adjusted under 35 U.S.C. 154(b) by 230 days.

(21) Appl. No.: 17/432,916

(22) PCT Filed: Mar. 4, 2020

(86) PCT No.: PCT/RU2020/050037
§ 371 (c)(1),
(2) Date: Aug. 21, 2021

(87) PCT Pub. No.: WO2020/185124
PCT Pub. Date: Sep. 17, 2020

(65) Prior Publication Data
US 2022/0199847 A1 Jun. 23, 2022

(30) Foreign Application Priority Data
Mar. 12, 2019 (RU) .................................. 2019106820

(51) Int. Cl.
*H01L 31/107* (2006.01)
*H01L 31/0224* (2006.01)
(Continued)

(52) U.S. Cl.
CPC .......... *H01L 31/107* (2013.01); *H01L 31/028* (2013.01); *H01L 31/022466* (2013.01); *H01L 31/182* (2013.01)

(58) Field of Classification Search
None
See application file for complete search history.

(56) References Cited

U.S. PATENT DOCUMENTS 7,829,915 B2 11/2010 Shi et al.
9,035,410 B2 5/2015 Yuan et al.
(Continued)

FOREIGN PATENT DOCUMENTS

CN 1507079 A * 6/2004 ......... H01L 27/1443
CN 206992134 U * 2/2018 ......... H01L 27/1443
(Continued)

OTHER PUBLICATIONS

Search Report in PCT/RU2020/050037 dated Sep. 8, 2020.

*Primary Examiner* — Evren Seven
(74) *Attorney, Agent, or Firm* — Bardmesser Law Group

(57) ABSTRACT

An APD includes a photoconverter and at least one avalanche amplifier of the photocurrent, the amplifier having two layers—a contact layer and a multiplication layer, wherein the multiplication layer is formed on top of the entire conductive wafer, while the contact layer of at least one avalanche amplifier is formed on top of a certain area of the multiplication layer. Meanwhile, outside the contact layer, the multiplication layer functions as a photoconverter. This makes it possible for photocarriers to get into the avalanche amplifier effectively and unimpeded. In order to mitigate the influence of parasite near-surface charge carriers on the avalanche amplifier, its multiplication region is deepened in relation to the upper surface of the photoconverter region. The proposed APD embodiment with less dark (Continued)

current seeping from peripheral areas of the instrument provides higher threshold sensitivity that allows it be on par with state of the art.

19 Claims, 5 Drawing Sheets

(51) Int. Cl.
  *H01L 31/028*   (2006.01)
  *H01L 31/18*    (2006.01)

(56) References Cited

U.S. PATENT DOCUMENTS

| | | |
|---|---|---|
| 9,570,647 B2 | 2/2017 | Yuan et al. |
| 10,340,407 B2 | 7/2019 | Shubin et al. |

FOREIGN PATENT DOCUMENTS

| | | | | |
|---|---|---|---|---|
| JP | 3837606 B2 | * | 10/2006 | ....... H01L 31/03529 |
| WO | WO-2004102680 A1 | * | 11/2004 | ........... H01L 31/107 |
| WO | WO-2018189898 A1 | * | 10/2018 | |

* cited by examiner

AVALANCHE PHOTODETECTOR (VARIANTS) AND METHOD FOR MANUFACTURING THE SAME (VARIANTS)

CROSS REFERENCE TO RELATED APPLICATIONS

This application is a US National Phase of PCT/RU2020/050037, filed on Mar. 4, 2020, which claims priority to Russian Patent Application No. 2019106820, filed on Mar. 12, 2019.

TECHNICAL FIELD

The invention relates to avalanche photodetectors (APD), which are fast and highly-sensitive instruments, widely used in LiDARs, communications systems, machine vision, robotics, medicine, biology, environmental monitoring, etc.

BACKGROUND OF THE RELATED ART

A conventional avalanche photodetector (APD) comprises a number of semiconductor layers put onto a semiconductor wafer.

A group of the semiconductor layers forms a photoconverter, in which signal photons are absorbed generating free carriers, i.e., electrons and electron holes. These light-generated charge carriers then get into another group of semiconductor layers, i.e., an avalanche amplifier, inside which an area is formed where the intensity of electric field is sufficient for avalanche multiplication of the charge carriers.

In order to reduce the dark current of the avalanche amplifier and, therefore, increase the APD's threshold sensitivity, the area occupied by the avalanche amplifier can be made smaller in relation to the area occupied by the photoconverter.

In APDs disclosed in U.S. Pat. No. 9,035,410 and RU 2,641,620, the avalanche amplifier that comprises two layers—a contact layer and a multiplication layer—and the photoconverter are both located on the same wafer, wherein the area of the photoconverter is greater than that of the amplifier.

Parameters of such instruments can be additionally optimized, i.e., threshold sensitivity can be improved by shrinking the area of the avalanche amplifier. In the APD according to the patent RU 2,641,620, the multiplication layer is made of a semiconductor material with the same conductivity type as the signal photoconverter, faces the wafer and adjoins the autonomous photoconverter, which allows to reduce excessive dark noises caused by photocarriers being transmitted from the photoconverter to the avalanche amplifier over an external electrical circuit (see U.S. Pat. No. 9,035,410).

DRAWBACKS OF THE RELATED ART

In the APD according to the patent RU 2,641,620, the multiplication layer is made independent of the photoconverter, which hinders photocarriers generated in the photoconverter layer from getting to the multiplication layer, thus causing multiplied photosignal losses. This results in deteriorated threshold sensitivity, which is a basic parameter of an APD.

TECHNICAL PROBLEM

The objective of the present disclosure is to create an avalanche photodetector (APD) having a high threshold sensitivity, which will not be limited by inefficient transmission of photocarriers from the photoconverter to the avalanche amplifier. Besides, the proposed embodiments of the claimed APD allow one to reduce its dark current.

By solving these problems, it will be possible to improve the APD's threshold sensitivity, its basic parameter.

SUMMARY OF INVENTION

The claimed invention comprises an avalanche photodetector (APD) and a method for manufacturing the same, which allows one to make the transmission of photocarriers from the photoconverter to the avalanche amplifier more efficient by putting the multiplication layer all over the conductive wafer. The contact layer of at least one avalanche amplifier is formed in a certain area of the multiplication layer. Thus, the multiplication layer outside the contact layer functions as a photoconverter. As a result, the photocarriers that have been initiated in the photoconverter will get into the multiplication region of the avalanche amplifier unimpeded. The first electrode and the second electrode of the avalanche photodetector are placed on the contact layer and the wafer, respectively.

In order to mitigate the influence of parasitic near-surface charge carriers on the avalanche amplifier, its multiplication region is deepened in relation to the upper surface of the photoconverter region by etching a notch in the multiplication layer and forming a contact layer of the avalanche amplifier at the bottom of said notch.

In order to reduce the APD's dark current from adjacent wafer regions, a closed groove is etched on the multiplication layer surface, its depth is greater than or equal to the multiplication layer thickness, but less than a total thickness of the wafer and multiplication layer combined, and a photodetector is formed inside the region bounded by said groove. The groove is filled with highly doped polycrystalline silicon of the same conductivity type as the multiplication layer.

For increased efficiency, the semiconductor wafer should be made of low-resistance materials.

It is preferable that both the wafer and multiplication layer are made of the same semiconductor material.

The multiplication layer on the wafer surface can be made using the epitaxy method, and the contact layer can be made by doping the multiplication layer with a dopant that forms a layer with the opposite conductivity.

It is also preferable that the groove has a width of 1.5 μm to 2.0 μm.

It is also possible to put a high-resistance layer between the contact layer of the avalanche amplifier and the first electrode.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a schematic transversal section of the claimed APD according to the first embodiment that comprises a semiconductor wafer 101, a multiplication layer 102 covering the entire surface of the semiconductor wafer with the same conductivity type as the multiplication layer, a dielectric layer 103 covering the multiplication layer 102 surface and side walls of a notch 104, which is 0.5-2.5 μm deep, for a contact layer 105, the contact layer 105 which is made through diffusion from highly doped polycrystalline silicon with the opposite conductivity to that of the multiplication layer, wherein at least one avalanche amplifier 106 and photoconverter 107, which is outside the avalanche amplifier, a first electrode 108 located on top of the highly doped polycrystalline silicon that fills the notch 104 and of the transparent dielectric layer 103, and a second electrode 109, which is formed on the bottom surface of the semiconductor wafer 101.

Figure 1:
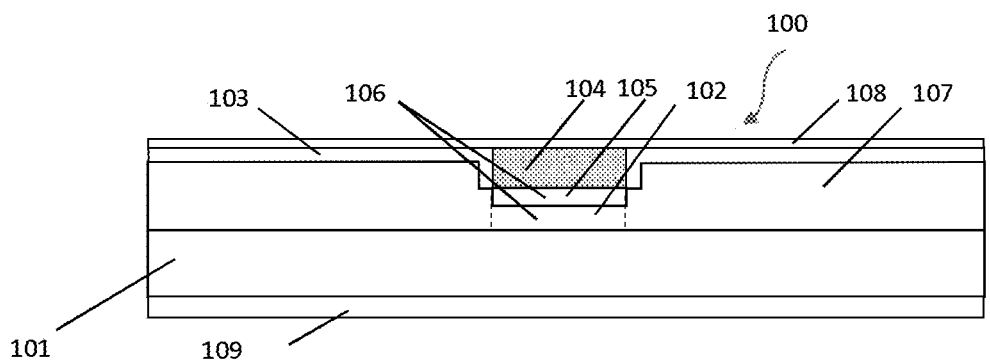
FIG. 1A shows the process of putting the multiplication layer 102 onto the silicon wafer 101.
FIG. 1B shows the process of putting the dielectric layer 103 onto the multiplication layer 102.
Figure 1A:
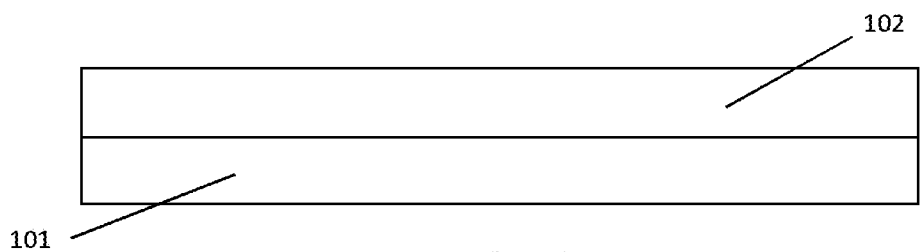
Figure 1B:
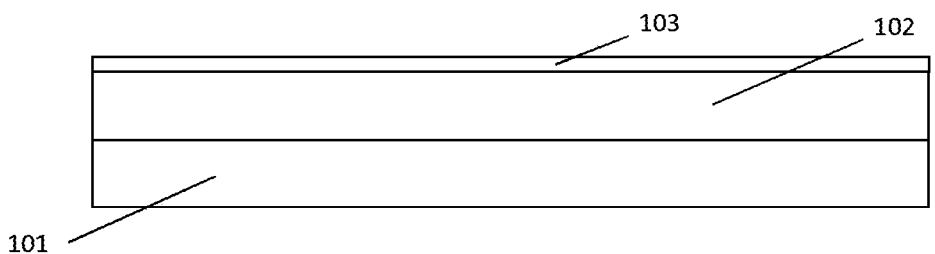
Figure 1C:
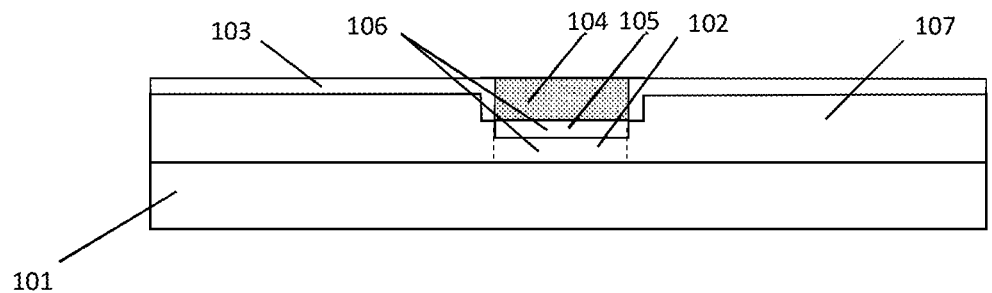

FIG. 1C shows the process of forming the avalanche amplifier 106 regions by creating a contact layer 105 through diffusion from the highly doped polycrystalline silicon filling the notch 104, which is 0.5-2.5 μm deep, with the opposite conductivity to that of the multiplication layer, wherein at least one avalanche amplifier 106 and photoconverter 107, which is outside the avalanche amplifier, are formed.

Figure 1D:
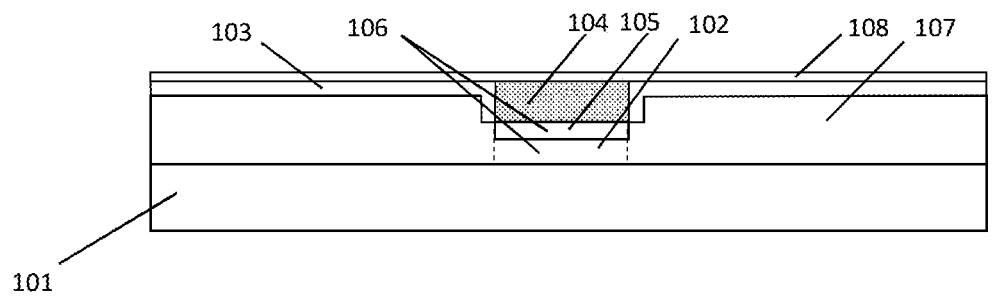

FIG. 1D shows the process of forming the first electrode 108 made of a transparent conductive material on the surfaces of the highly doped polycrystalline silicon, which fills the notch 104, and the dielectric layer 103.

Figure 1E:
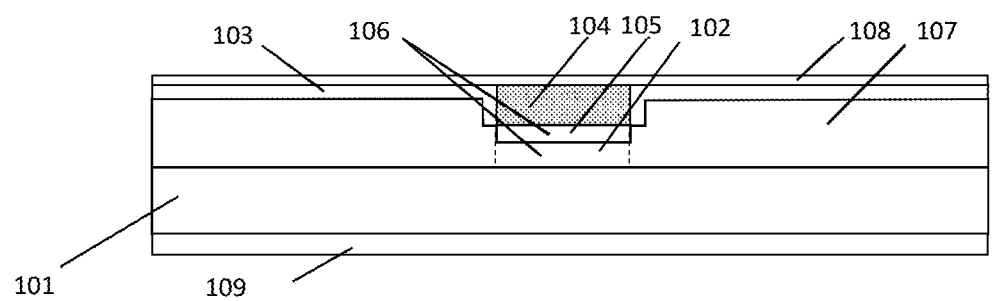

FIG. 1E shows the process of forming the second electrode 109 on the semiconductor wafer 101.

Figure 2:
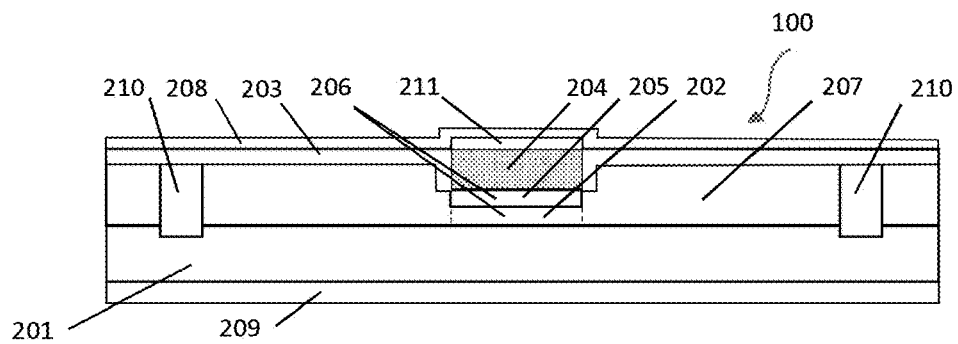

FIG. 2 is a schematic transversal section of the claimed APD according to the second embodiment that comprises a semiconductor wafer 201, a multiplication layer 202 covering the entire surface of the semiconductor wafer with the same conductivity type as the multiplication layer, a dielectric layer 203 covering the multiplication layer 202 surface and side walls of a notch 204 for a contact layer 205, a contact layer 205 which is made through diffusion from highly doped polycrystalline silicon with the opposite conductivity to that of the multiplication layer, that fills a notch 204, which is 0.5-2.5 μm deep, wherein at least one avalanche amplifier 206 and photoconverter 207 are formed, a closed groove 210 with the width of 1.5 μm to 2.0 μm and the depth that is more than or equal to the multiplication layer thickness but less than the total thickness of the wafer and multiplication layer combined, which is filled with highly doped polycrystalline silicon of the same conductivity type as the multiplication layer and encircles avalanche amplifiers and the photoconverter, a high-resistance layer 211 that is formed on the highly doped polycrystalline silicon filling the notch 204, a transparent electrode 208, which is formed on the high-resistance layer 211 and dielectric layer 203 surfaces, and a second electrode 209, which is formed on the semiconductor wafer 201.

Figure 2A:
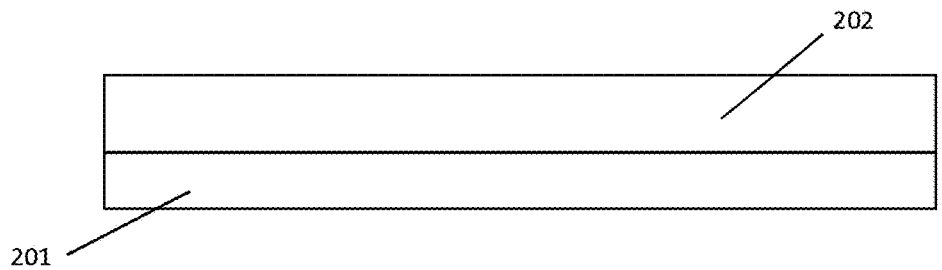

FIG. 2A shows the process of forming the multiplication layer 202 on the silicon wafer 201.

Figure 2B:
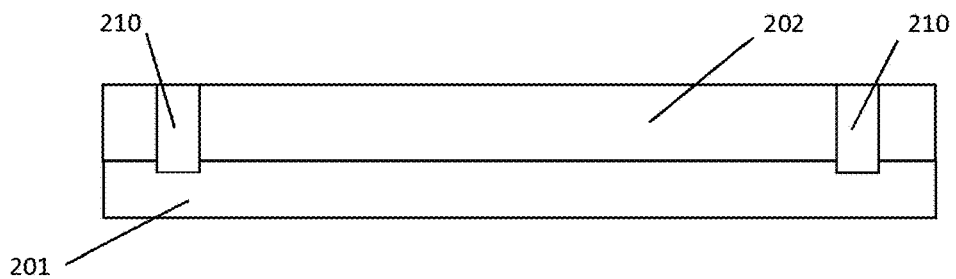

FIG. 2B shows the process of forming a closed groove 210, which is filled with highly doped polycrystalline silicon of the same conductivity type as the multiplication layer, so that the photodetector can be formed inside the region bounded by said groove.

Figure 2C:
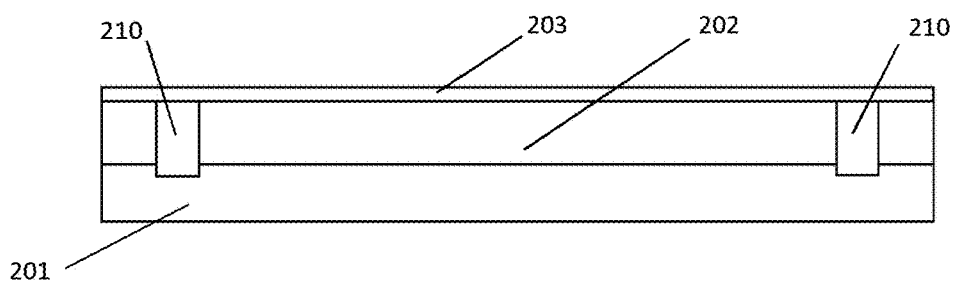

FIG. 2C shows the process of putting the dielectric layer 203 onto the multiplication layer 202.

Figure 2D:
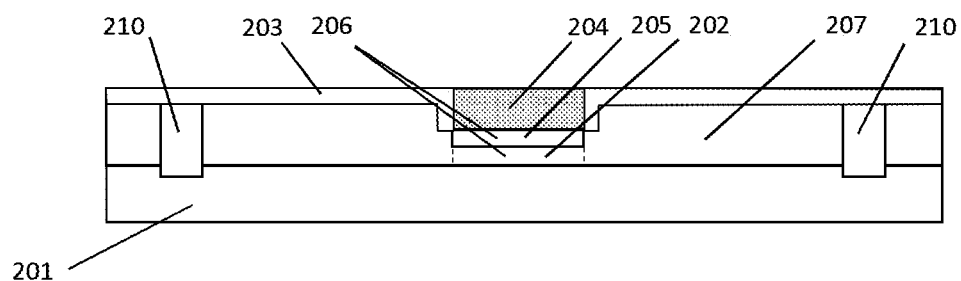

FIG. 2D shows the process of forming the avalanche amplifier 206 regions by creating a contact layer 205 through diffusion from the highly doped polycrystalline silicon filling the notch 204 that is 0.5-2.5 μm deep, with the opposite conductivity to that of the multiplication layer, wherein at least one avalanche amplifier 206 and photoconverter 207, which is outside the avalanche amplifier, are formed.

Figure 2E:
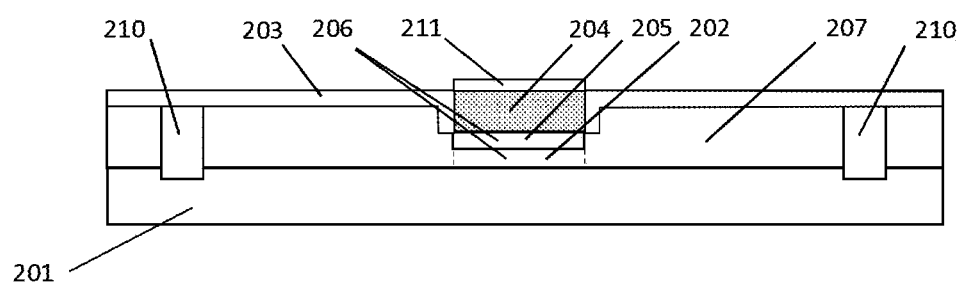

FIG. 2E shows the process of forming a high-resistance layer 211 on the contact layer 205 of the avalanche amplifier 206.

Figure 2F:
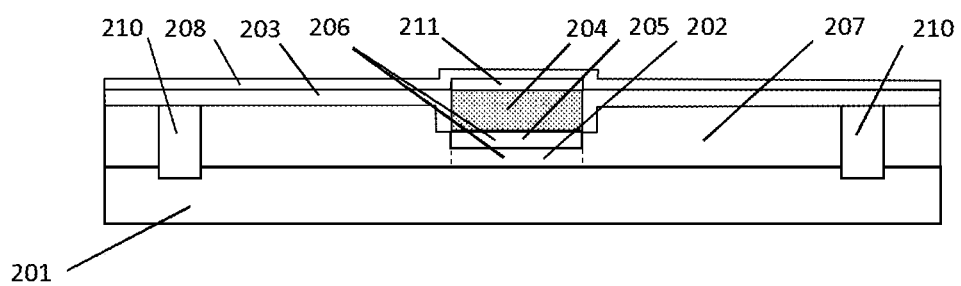

FIG. 2F shows the process of forming the first electrode 208 made of a transparent conductive material on the surfaces of the highly doped polycrystalline silicon that fills the notch 204, and the dielectric layer 203.

Figure 2G:
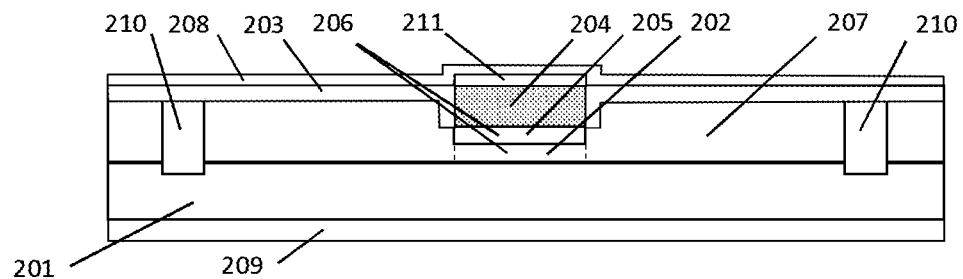

FIG. 2G shows the process of forming the second electrode 209 on the semiconductor wafer 201.

Figure 3A:
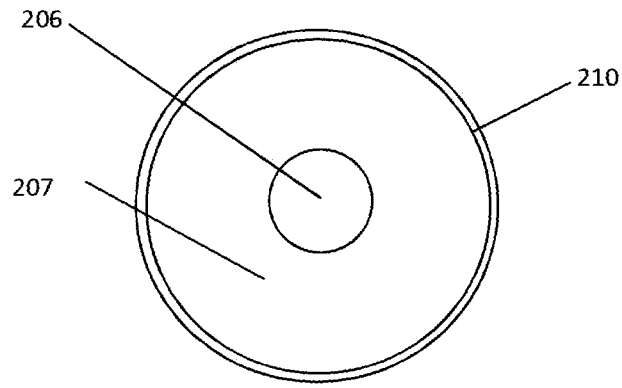

FIG. 3A is a schematic top view of the APD according to the second embodiment that comprises a single avalanche amplifier 206 and a groove 210.

Figure 3B:
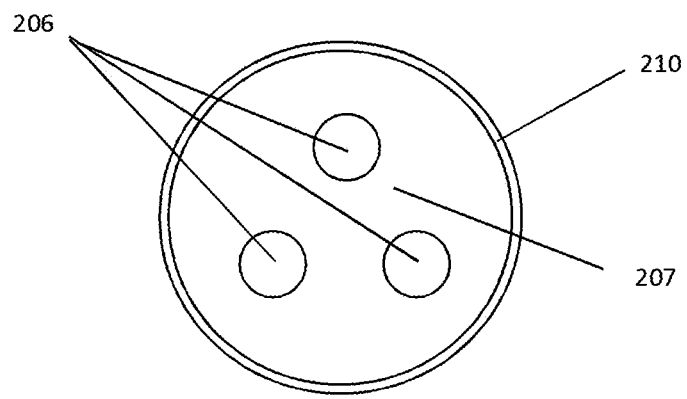

FIG. 3B is a schematic top view of the APD according to the second embodiment that comprises three avalanche amplifiers 206 and a groove 210.

DETAILED DESCRIPTION OF PREFERRED EMBODIMENTS

Reference will now be made in detail to the preferred embodiments of the present invention, examples of which are illustrated in the accompanying drawings.

The reference markings used across the present disclosure and accompanying drawings, except number 100 (incident light), consist of three digits, wherein the first digit is the figure number and the last two digits mark a specific element of the design.

For example, marking 206 points at the element number 06 (see the list below) in FIG. 2.

The following markings are used to point at specific elements of the design:

01—wafer,
02—multiplication layer,
03—dielectric layer,
04—a notch filled with highly doped polycrystalline silicon,
05—contact layer,
06—avalanche amplifier,
07—photoconverter,
08—first transparent electrode,
09—second electrode,
10—closed groove,
11—high-resistance material layer.

FIG. 1 shows a schematic transversal section of the claimed APD according to the first embodiment that comprises a semiconductor wafer 101, a multiplication layer 102 covering the entire surface of the semiconductor wafer with the same conductivity type as the multiplication layer, a dielectric layer 103 covering the multiplication layer 102 surface, a notch 104 that is filled with highly doped polycrystalline silicon, a contact layer 105 which is made through diffusion of the dopant from highly doped polycrystalline silicon with the opposite conductivity to that of the multiplication layer, wherein at least one avalanche amplifier 106 and photoconverter 107, which is outside the avalanche amplifier, are formed, a first electrode 108 made of a transparent material, which is located on top of the highly doped polycrystalline silicon that fills the notch 104, and of the dielectric layer 103, and a second electrode 109, which is formed on the bottom surface of the semiconductor wafer 101.

The method for manufacturing the APD as shown in FIG. 1 is further illustrated by FIGS. 1A, 1B, 1C, 1D, 1E, 1F and comprises the following sequence of steps:

Putting, onto the silicon wafer 101, a multiplication layer 102 of the same conductivity type as the wafer (see FIG. 1A).

Putting, on top of the multiplication layer 102, a dielectric layer 103 (see FIG. 1B).

Forming, in the multiplication layer, one or more avalanche amplifier 106 regions by etching a notch 104 that is 0.5-2.5 μm deep in both the dielectric layer 103 and multiplication layer 102, covering its side walls with a dielectric layer and filling it with highly doped polycrystalline silicon (see FIG. 1C).

Forming a contact layer 105 through diffusion of the dopant from highly doped polycrystalline silicon with the opposite conductivity to that of the multiplication layer, that fills the notch 104, wherein at least one avalanche amplifier 106 and photoconverter 107, which is outside the avalanche amplifier, are formed (see FIG. 1D).

Forming, on the surfaces of the highly doped polycrystalline silicon that fills the notch 104 and of the dielectric layer 103, a first electrode 108, which is made of a transparent conductive material (see FIG. 1E).

Forming, on the bottom surface of the semiconductor wafer 101, a second electrode 109 (see FIG. 1F).

An exemplary APD according to FIG. 1 can be manufactured using the method that involves formation, by epitaxy, of the multiplication layer 102, which has width of 5-7 μm and is made of p-type silicon with dopant concentration of $10^{15}$-$10^{17}$ cm$^{-3}$, on the silicon wafer 101 of the p+-type with dopant concentration higher than $10^{18}$ cm$^{-3}$. At least one avalanche amplifier 106 is formed on the multiplication layer surface, by etching a notch 104 that is 0.5-2.5 μm deep in both the dielectric layer 103 and multiplication layer 102, covering its side walls with a dielectric layer and filling it with highly doped polycrystalline silicon with dopant concentration higher than $10^{18}$ cm$^{-3}$ and with the opposite conductivity to that of the multiplication layer 102, and then diffusing said dopant into the multiplication layer 102 in order to form a contact layer 105, wherein a photoconverter layer 107 is formed outside the avalanche amplifier 106.

The first electrode 108, which is made of a transparent material of ITO or AZO type, is formed on the highly doped polycrystalline silicon that fills the notch 104 and dielectric layer 104 surfaces, while the second electrode 109, which is an aluminum foil with thickness of approximately 0.5-1.0 μm, is formed on the bottom surface of the semiconductor wafer 101.

The APD as shown in FIG. 1 operates as follows:

Positive voltage is applied to the electrode 108 relative to the electrode 109, enough to trigger impact ionization in the multiplication layer 102 of the avalanche amplifier 106 causing free charge carriers to multiply.

Incident light 100 falling upon the photoconverter 107 surface is absorbed, generating free charge carriers, i.e., electrons and electron holes. Free electrons that have been induced by light (photoelectrons) in the photoconverter 107 drift towards the avalanche multiplication layer 102, driven by superposition of electric fields, one of which seeps from the avalanche amplifier 106 and the other is induced by the first electrode 108 in the photoconverter, to be multiplied there, generating the APD's output signal, while the holes make their way into the wafer 101. Photoelectrons that have been induced by light in the non-depleted area of the photoconverter 107, are gathered in the depletion area of the photoconverter by means of diffusion caused by free electron concentration gradient in the photoconverter.

In order to mitigate the influence of parasite near-surface charge carriers on the avalanche amplifier, its multiplication region is deepened in relation to the upper surface of the photoconverter region by etching a notch 104 in the multiplication layer and forming a contact layer 105 of the avalanche amplifier 106 at the bottom of said notch. At the same time, photocarriers from actual long-wave recorded signals can efficiently get from the photoconverter into the avalanche amplifier region, whereas the inflow of dark carriers from the dielectric-photoconverter interface is impeded.

FIG. 2 shows a schematic transversal section of the claimed APD according to the second embodiment that comprises a semiconductor wafer 201, a multiplication layer 202 covering the entire surface of the semiconductor wafer with the same conductivity type as the multiplication layer, a dielectric layer 203 covering the multiplication layer 202 surface, a notch 204 that is filled with highly doped polycrystalline silicon, a contact layer 205 which is made through diffusion of the dopant from highly doped polycrystalline silicon with the opposite conductivity to that of the multiplication layer, that fills a notch 204, which is 0.5-2.5 μm deep.

At least one avalanche amplifier 206 and photoconverter 207, which is outside the avalanche amplifier, are formed, a closed groove 210 with the width of 1.5 μm to 2.0 μm and the depth, which is more than or equal to the multiplication layer thickness, but less than the total thickness of the wafer and multiplication layer combined, and which is filled with highly doped polycrystalline silicon of the same conductivity type as the multiplication layer and encircles avalanche amplifiers and the photoconverter, a high-resistance layer 211 that is formed on the highly doped polycrystalline silicon filling the notch 204, a transparent electrode 208, which is formed on the high-resistance layer 211 and dielectric layer 203 surfaces, and a second electrode 209, which is formed on the semiconductor wafer 201.

The method for manufacturing the APD as shown in FIG. 2 is further illustrated by FIGS. 2A, 2B, 2C, 2D, 2E, 2F, 2G, 2H and comprises the following sequence of steps:

Putting, onto the silicon wafer 201, a multiplication layer 202 of the same conductivity type as the wafer (see FIG. 2A).

Etching, on the multiplication layer 202 surface, a closed groove 210 with the depth, which is more than or equal to the multiplication layer thickness, but less than the total thickness of the wafer and multiplication layer combined, and filling it with highly doped polycrystalline silicon of the same conductivity type as the multiplication layer 202, so that a photodetector can be formed inside the region bounded by said groove (see FIG. 2B).

Putting, onto the multiplication layer 202 and notch 204, a dielectric layer 203 (see FIG. 2C).

Forming, in the multiplication layer, one or more avalanche amplifier 206 regions by etching a notch 204 that is 0.5-2.5 μm deep in both the dielectric layer 203 and multiplication layer 202, covering its side walls with a dielectric layer and filling it with highly doped polycrystalline silicon (see FIG. 2D).

Forming a contact layer 205 through diffusion of the dopant from highly doped polycrystalline silicon with the opposite conductivity to that of the multiplication layer, that fills the notch 204, wherein at least one avalanche amplifier 206 and photoconverter 207, which is outside the avalanche amplifier, are formed (see FIG. 2E).

Forming, on the surface of the highly doped polycrystalline silicon filling the notch 204, a high-resistance layer 211 (see FIG. 2F).

Forming, on top of the high-resistance layer 211 and dielectric layer 203, a first electrode 208 made of a transparent conductive material (see FIG. 2G);

Forming, on the bottom surface of the semiconductor wafer 201, a second electrode 209 (see FIG. 2H).

An exemplary APD according to FIG. 2 can be manufactured using the method that involves formation, by epitaxy, of the multiplication layer 202, which has width of 5-7 μm and is made of p-type silicon with dopant concentration of $10^{15}$-$10^{17}$ cm$^{-3}$, on the silicon wafer 201 of the p+-type with dopant concentration higher than $10^{18}$ cm$^{-3}$. Then, a closed groove 210 with the width of 1.5 μm to 2.0 μm and the depth, which more than or equal to the multiplication layer thickness, but less than the total thickness of the wafer and multiplication layer combined, is etched on the multiplication layer 202 surface and filled with highly doped polycrystalline silicon of the same conductivity type as the multiplication layer 202, so that a photodetector can be formed inside the region bounded by said groove.

At least one avalanche amplifier 205 is formed on the multiplication layer 202 surface, by etching a notch that is 0.5-2.5 μm deep in both the dielectric layer and multiplication layer, covering its side walls with a dielectric layer and filling it with highly doped polycrystalline silicon with dopant concentration higher than $10^{18}$ cm$^{-3}$ and with the opposite conductivity to that of the multiplication layer 202, and then diffusing the dopant into the multiplication layer 202 in order to form a contact layer 205, wherein a photoconverter layer 207 is formed outside the avalanche amplifier 206. The high-resistance layer 211 that is made of high-resistance polycrystalline silicon (e.g., at least 1 megaohm/μm$^2$ at layer thickness 100 nm) is formed on the highly doped polycrystalline silicon filling the notch 204. The first electrode 207, which is made of a transparent material of ITO or AZO type, is formed on top of both the high-resistance layer 211 and dielectric layer 203, while the second electrode 208, which is an aluminum foil with thickness of approximately 0.5-1.0 μm, is formed on the bottom surface of the semiconductor wafer 201.

The APD according to the embodiment as shown in FIG. 2, i.e., having a closed groove 210, is characterized in that it allows to suppress the inflow of parasitic charge carriers, which get into the avalanche amplifier from neighboring regions. In order to effectively suppress such parasite currents, the groove, whose depth is more than the multiplication layer thickness, is to be filled with highly doped polycrystalline silicon of the same conductivity type as the multiplication layer. Less dark current in the APD results in additional improvement of threshold sensitivity.

The high-resistance layer 211, which is located on top of the highly doped polycrystalline silicon that fills the notch 104, provides negative feedback when the avalanche is formed, thus allowing to achieve higher multiplication coefficients, particularly, when operating in a so-called "Geiger" mode.

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A method for manufacturing an avalanche photodetector, the method comprising:
   forming a multiplication layer on an entire surface of a semiconductor wafer;
   covering an entire surface of the multiplication layer with a dielectric layer;
   forming, on an upper surface of the multiplication layer and dielectric layer, at least one avalanche amplifier by etching a notch in both the dielectric layer and multiplication layer, wherein side walls of the notch are covered with a dielectric layer;
   forming a contact layer of the at least one avalanche amplifier by (i) filling the notch with highly doped polycrystalline silicon with an opposite conductivity of the multiplication layer, then (ii) followed by diffusion of a dopant from the polycrystalline silicon area into the multiplication layer, wherein a photoconverter layer is formed outside the notch;
   forming a first electrode made of a transparent material on surfaces of both the contact layer and dielectric layer; and
   forming a second electrode on a bottom surface of the semiconductor wafer.

2. The method of claim 1, wherein the notch is circular in plan view.

3. The method of claim 1, wherein the notch is hexagonal in plan view.

4. The method of claim 1, wherein the semiconductor wafer is made of a low-resistance material.

5. The method of claim 1, wherein both the semiconductor wafer and the multiplication layer are made of the same semiconductor material.

6. The method of claim 1, wherein the multiplication layer is formed on the semiconductor wafer surface using an epitaxy method.

7. The method of claim 1, wherein the notch that has a depth of 0.5 μm to 2.5 μm.

8. A method for manufacturing an avalanche photodetector, the method comprising the following steps:
   forming a multiplication layer on an entire surface of a semiconductor wafer;
   etching a closed groove on a surface of the multiplication layer, so that a depth of the closed groove is greater than or equal to a thickness of the multiplication layer thickness, but less than a total thickness of the wafer and multiplication layer combined, wherein a photodetector is formed inside a region bounded by the closed groove;
   filling the groove with highly doped polycrystalline silicon of a same conductivity type as the multiplication layer;
   covering the multiplication layer with a dielectric layer;
   forming, inside the region bounded by the closed groove, at least one avalanche amplifier by etching a notch in both the dielectric layer and the multiplication layer, wherein side walls of the notch are covered with a dielectric;
   forming a contact layer of the at least one avalanche amplifier by (i) filling the notch with highly doped polycrystalline silicon with an opposite conductivity as the multiplication layer, (ii) followed by diffusion of dopant from the polycrystalline silicon area into the multiplication layer wherein a the photoconverter layer is formed outside an area of the notch that had been etched;

forming a high-resistance layer on the contact layer surface;

forming a first electrode made of a transparent material on surfaces of both the high-resistance layer and the dielectric layer; and forming a second electrode on a bottom surface of the semiconductor wafer.

9. The method of claim 8, wherein the semiconductor wafer is made of a low-resistance material.

10. The method of claim 8, wherein both the semiconductor wafer and the multiplication layer are made of the same semiconductor material.

11. The method of claim 8, wherein the multiplication layer is formed on the semiconductor wafer surface using an epitaxy method.

12. The method of claim 8, wherein the notch that has a depth of 0.5 µm to 2.5 µm.

13. The method of claim 8, wherein the closed groove has a width of 1.5 µm to 2.0 µm.

14. The method of claim 8, wherein the high-resistance layer is formed on the contact layer of the avalanche amplifier before the first electrode is formed.

15. An avalanche photodetector comprising:
a semiconductor wafer;
a multiplication layer covering a top surface of the semiconductor wafer;
a dielectric layer above the multiplication layer;
at least one avalanche amplifier that includes (i) a contact layer formed by diffusing a dopant from the highly doped polycrystalline silicon with an opposite conductivity of the multiplication layer, that fills a notch formed in the etched-away area of the multiplication layer and the dielectric layer, such that a side surface of the multiplication layer is covered with a dielectric material, and (ii) photoconverter, which is outside the contact layer,
a first electrode made of a transparent material on surfaces of the contact layer and dielectric layer; and
a second electrode formed on a bottom surface of the semiconductor wafer.

16. The avalanche photodetector of claim 15, wherein the notch etched in the dielectric layer and the multiplication layer has depth of 0.5 µm to 2.5 µm.

17. The avalanche photodetector of claim 15, further comprising a closed groove, whose depth is greater than or equal to the multiplication layer thickness, but less than a total thickness of the semiconductor wafer and the multiplication layer combined, wherein the closed groove is filled with highly doped polycrystalline silicon of the same conductivity type as the multiplication layer, and wherein the at least one avalanche amplifier and the photoconverter are inside the closed groove.

18. The avalanche photodetector of claim 17, wherein the closed groove has width of 1.5 µm to 2.0 µm.

19. The avalanche photodetector of claim 17, further comprising a high-resistance layer sandwiched between the contact layer and the first electrode.

\* \* \* \* \*